United States Patent
Morton

(10) Patent No.: US 7,038,494 B2
(45) Date of Patent: May 2, 2006

(54) SCAN CHAIN ELEMENT AND ASSOCIATED METHOD

(75) Inventor: Gary Morton, Bristol (GB)

(73) Assignee: STMicroelectronics Limited, (GB)

( * ) Notice: Subject to any disclaimer, the term of this patent is extended or adjusted under 35 U.S.C. 154(b) by 494 days.

(21) Appl. No.: 10/274,098

(22) Filed: Oct. 17, 2002

(65) Prior Publication Data
US 2004/0078741 A1    Apr. 22, 2004

(51) Int. Cl.
*H03K 19/00*   (2006.01)

(52) U.S. Cl. .................. 326/93; 714/726; 327/202

(58) Field of Classification Search ............... 326/93; 327/202
See application file for complete search history.

(56) References Cited

U.S. PATENT DOCUMENTS 4,495,629 A * 1/1985 Zasio et al. ............... 377/70
6,148,425 A * 11/2000 Bhawmik et al. ........... 714/726
2005/0005214 A1 * 1/2005 Ueda ......................... 714/726

OTHER PUBLICATIONS

Sheth, A.M.; Savir, J.; Single-clock, single-latch, scan design; Instrumentation and Measurement, IEEE Transactions on; vol.: 52 Issue: 5 Oct. 2003; pp.: 1455-1457.*

* cited by examiner

*Primary Examiner*—R. Stephen Dildine
(74) *Attorney, Agent, or Firm*—Jenkens & Gilchrist, PC

(57) ABSTRACT

A scan chain element in an integrated circuit, the scan chain element including; a first latch connected to accept test data as an input, a second latch connected to accept the output of the first latch as an input, control logic for accepting a clock signal and a hold signal, the scan chain element being operable in a first mode such that the control logic is configured to supply the clock signal to the first latch and subsequently, in response to the hold signal, to supply the clock signal to the second latch to latch the data from the output of the first latch.

20 Claims, 4 Drawing Sheets

SCAN CHAIN ELEMENT AND ASSOCIATED METHOD

BACKGROUND OF THE INVENTION

1. Technical Field of the Invention

The present invention relates to scan chains used in testing of integrated circuits, and more particularly to flip-flops for use in such scan chains.

The invention has been developed primarily for use with scan chains for testing system on chip (SoC) circuits, and will be described hereinafter with reference to this application. However, it will be appreciated that the invention can be applied to many other forms of integrated circuitry.

2. Description of Related Art

During testing of system on chip (SoC) designs, a predetermined stream of data is clocked into a serially connected set of D-type flip-flops on the chip. Once all of the data is latched by the relevant flip-flops and therefore available to the relevant inputs throughout the circuit, a suitable clock signal is applied to the circuitry. The results are then clocked out of the scan chain for interpretation.

A prior art multiplexed D-type flip-flop is shown in FIG. 1. It includes a positive-edge triggered flip-flop 10 with an output Q and optional outputs QN (inverted Q) and SO (dedicated scan output). The input to the flip-flop 10 is selected via a multiplexer (MUX) 11, which accepts as inputs D (normal functional data) and TI (scan test input). The mode of the MUX 11 is controlled by global scan enable test signal TE. If TE is low on the rising edge of the clock, then the value on the D input is captured into the flip-flop and made available at Q after a small delay. Conversely, when TE is high on a rising clock edge, the value at TI is clocked into the flip-flop and, again, made available at Q after a small delay.

One difficulty with this arrangement is that SoC designs often include multiple, asynchronous clock domains. In the absence of effort to balance all clock trees in scan mode, an attempt to capture all outputs simultaneously can result in incorrect data being captured due to skew between clocks in different domains. This problem is known as "shoot-through."

One way of reducing this problem is to restrict test pattern generation tools to only allow one scan clock to capture in a given test cycle. However, this requires an increase in the number of test patterns that need to be generated by the tool, which in turn has a detrimental impact on test vector usage and overall test time.

SUMMARY OF THE INVENTION

Embodiments of the present invention overcome the above-described shortcomings of prior scan testing techniques and provide a scan-chain element and corresponding scan test technique that are substantially impervious to shoot-through.

According to one aspect of the invention there is provided a scan chain element in an integrated circuit, the scan chain element including: a first latch connected to accept test data as an input; a second latch connected to accept the output of the first latch as an input; control logic for accepting a clock signal and a hold signal; the scan chain element being operable in a first mode such that the control logic is configured to supply the clock signal to the first latch and subsequently, in response to the hold signal, to supply the clock signal to the second latch to latch the data from the output of the first latch.

Another aspect of the invention provides a method of capturing data in a scan chain for testing circuitry, the scan chain including a plurality of scan chain elements, each of the scan chain elements including: a first latch connected to accept test data as an input; a second latch connected to accept the output of the first latch as an input; and control logic for accepting a clock signal and a hold signal; the method including the steps of: supplying the clock signal to the first latch, thereby to latch in the test data; asserting the hold signal; in response to the hold signal being asserted, supplying the clock signal to the second latch to latch the data from the output of the first latch.

BRIEF DESCRIPTION OF THE DRAWINGS

For a more complete understanding of the present invention, reference is made to the following detailed description taken in conjunction with the accompanying drawings wherein.

DETAILED DESCRIPTION OF A PREFERRED EMBODIMENT

Figure 1:
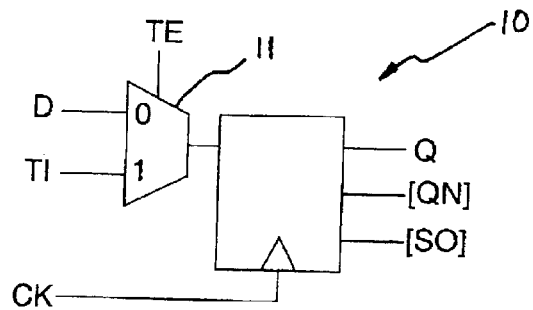
FIG. 1 is a schematic of a prior art scan chain element in the form of a multiplexed d-type flip-flop.
Figure 2:
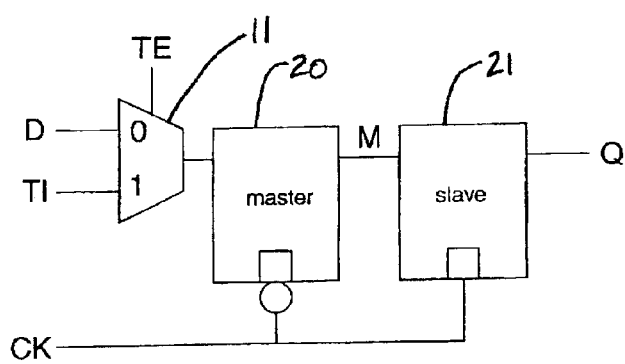
FIG. 2 is a schematic of a latch-based circuit equivalent to the d-type flip-flop of FIG. 1.

Reference is now made to the Drawings wherein like reference characters denote like or similar parts throughout the various Figures. Referring now to FIG. 2, FIG. 2 shows how the flip-flop of FIG. 1 can be considered in terms of a master latch 20 and a slave latch 21. The MUX 11 is as described in relation to FIG. 1. The master latch 20 is transparent (i.e., follows the input continuously) when the clock signal is low, whilst the slave latch is transparent when the clock signal is high. Within the present specification, the word "open" is used synonymously with "transparent", whilst "closed" is used synonymously with "latched." For the purposes of the description, the link between the output of the master latch and the input of the slave latch is labeled "M".

Figure 3:
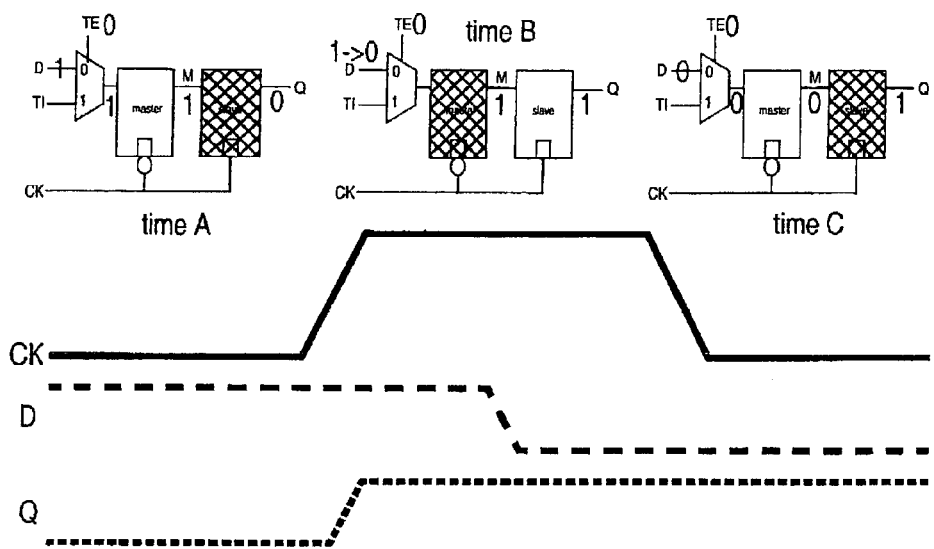
FIG. 3 is a schematic and signal timing diagram of the circuit of FIG. 2 whilst data is clocked through it.

Referring to the signal timing portion of FIG. 3, at time A, the clock is low, meaning that the master latch is open and the slave latch is closed. The slave stores the state of the flip-flop, and the value at Q represents the state held in the slave.

At time B, the clock goes high and the input data (either D or TI, depending upon the value of TE) is captured into the master latch as it closes. Simultaneously, the slave latch becomes open and the value in the master latch is passed to Q. Changes to the input at this stage will have no impact on the value of M or Q.

At time C, the clock goes low, which closes the slave latch such that the output of Q is latched at its present value.

Simultaneously, the master latch opens. Effectively, the state of the master latch has been passed on and latched in the slave latch.

Figure 5:
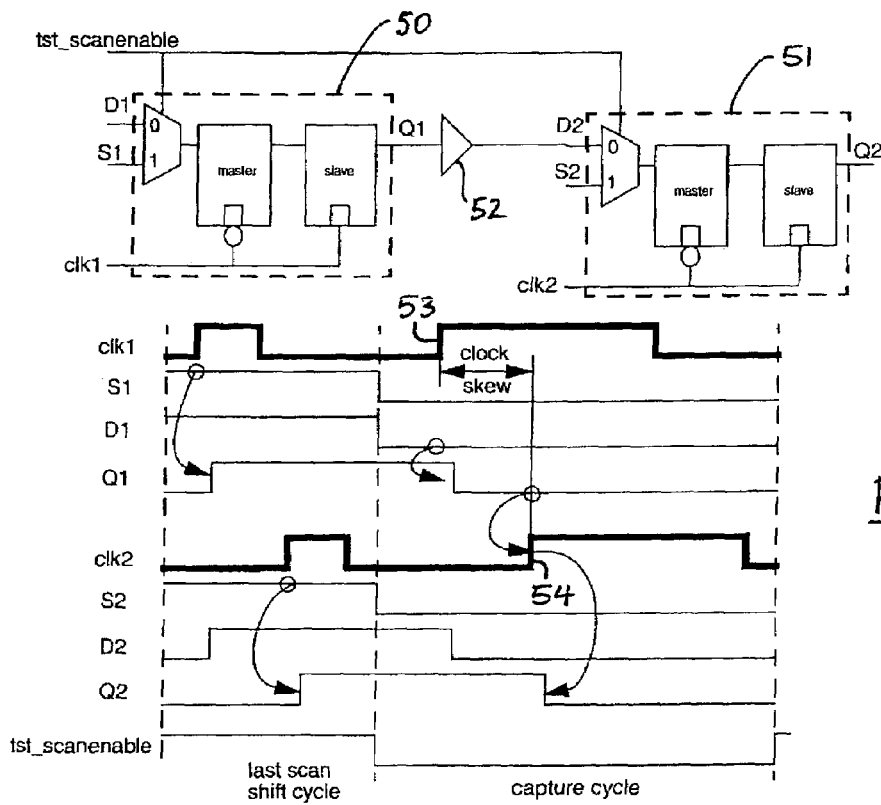
FIG. 5 is a schematic and associated signal timing diagram of two prior art serially connected scan chain elements.

FIG. 5 includes a pair of serially connected scan chain elements to illustrate the prior art problem of shoot-through. The first scan chain element 50 is in a first clock domain whilst the second scan-chain element 51 is in a second clock domain. The output of the first element 50 is connected to the data input D2 of the second element 51 via a buffer 52. The multiplexer in each of the elements is controlled by a common test enable signal "tst_scanenable".

There are two phases to scan-testing of the integrated circuit of which the elements 50 and 51 are a part. First, data is serially clocked into elements 50 and 51 via the S1 and S2 inputs during a scan shift cycle. It will be appreciated that there will typically be many more elements in a scan chain before and after the two illustrated. After the final scan shift cycle (shown in FIG. 5), all of the data in the elements is available to the correct respective inputs of the integrated circuits under test. In the example illustrated, both the first element 50 and the second element 51 hold a value of 1.

The test then moves into a capture phase, in which data is captured from the D1 and D2 inputs to the multiplexer. As can be seen in the timing diagram of FIG. 5, commencement of the capture phase is initiated by the tst_scanenable signal going low. It will be noted that as this happens, the value of D1 is 0 and the value of D2 is 1. The value on D1 is safely captured into the first element 50 at the first rising clock edge 53 in the capture phase. In the absence of shoot-through, the second element should capture the value that was at D2 (which is the value of the output of Q1) at the time the capture is intended to take place. However, if the result of capturing D1 into the first element 50 is made available at the output of Q1 before the clock edge reaches the second element 51, then the latched value of the first element 50 will be captured into the second element D2. In the present case, by the time the clock edge rises at point 54 in the clk2 domain, the output of the first latch has already settled to value 0 and been made available to the input of the second element 51. The original 1 value that was to have been captured at D2 from the output of the first element is therefore missed.

Figure 4:
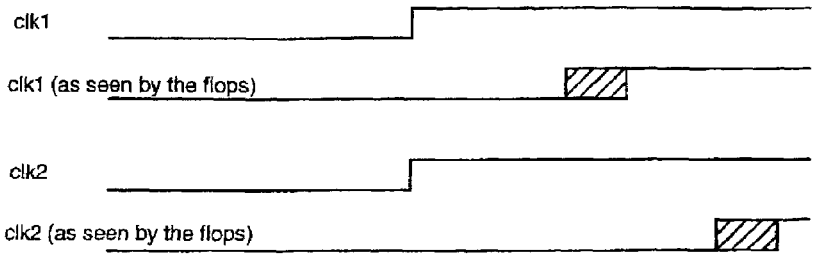
FIG. 4 is a signal timing diagram of clock signals compared to how those signals are seen by flip-flops in a prior art circuit.

In the example of FIG. 5, there are two (internal) clock domains: clk1 and clk2. Assuming that the top level pins that control these internal clocks are pulsed on the tester with exactly the same timing, clk2 is delayed relative to clk1 due to different clock buffering. FIG. 4 is a signal timing diagram of clock signals clk1 and clk2 showing how those clock signals exist in comparison to how those clock signals are seen by each of the flip-flops.

Shoot-through is a problem that can affect scan-shift, scan-capture or both, depending upon the particular circuit implementation. Scan shifting can be made safe by the insertion of a latch in the scan chain, where the scan path crosses clock domains. This type of latch is commonly referred to as a "lock-up latch". A more insidious problem is that of shoot-through in the capture cycle, as described above. This is because in most devices, there will be many functional paths that cross between clock domains. The classic condition for shoot-through is where clock skew is greater than functional path delay. It should be noted that the problem of shoot-through usually only applies to testing, since the circuitry is designed to take clock skew and functional delay into account by virtue of its design.

Figure 6:
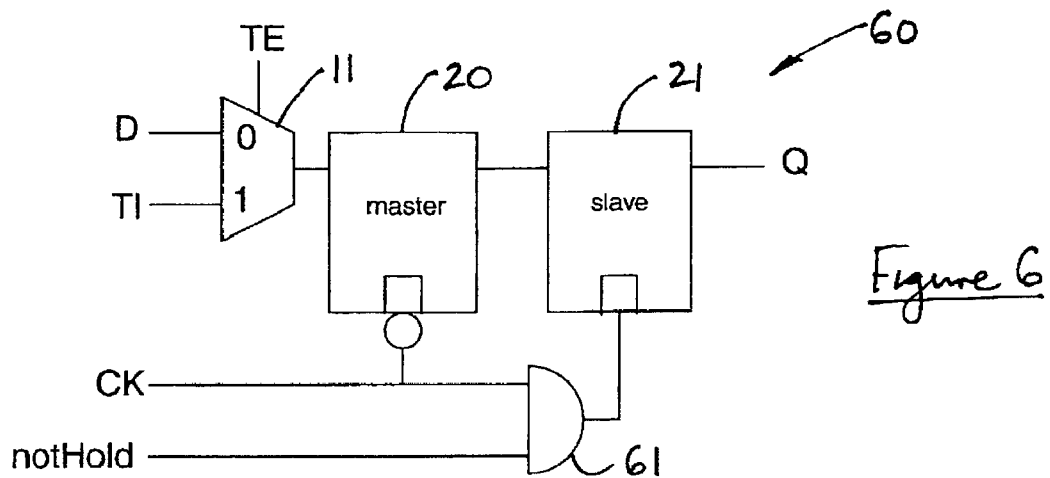
FIG. 6 is a schematic of a scan chain element, in accordance with the present invention.

Turning to FIG. 6, there is shown a scan-chain element 60 for substantially eliminating the effect of shoot-through during scan testing. The scan element is described in similar terms to that of the element in FIG. 2, and like features are designated using like numerals. The additional hardware feature of the element 60 is an AND gate 61 that accepts as inputs the CK signal for the element and a novel notHold signal.

It will be apparent to those skilled in the art of digital design that when the signal notHold is held high, the element 60 functions in exactly the same manner as the prior art element described in relation to FIG. 2 (save for a slight delay in CK reaching the second latch due to the AND gate 61). Conversely, when notHold is held low, the clock signal CK is effectively disconnected from the second latch.

Figure 7:
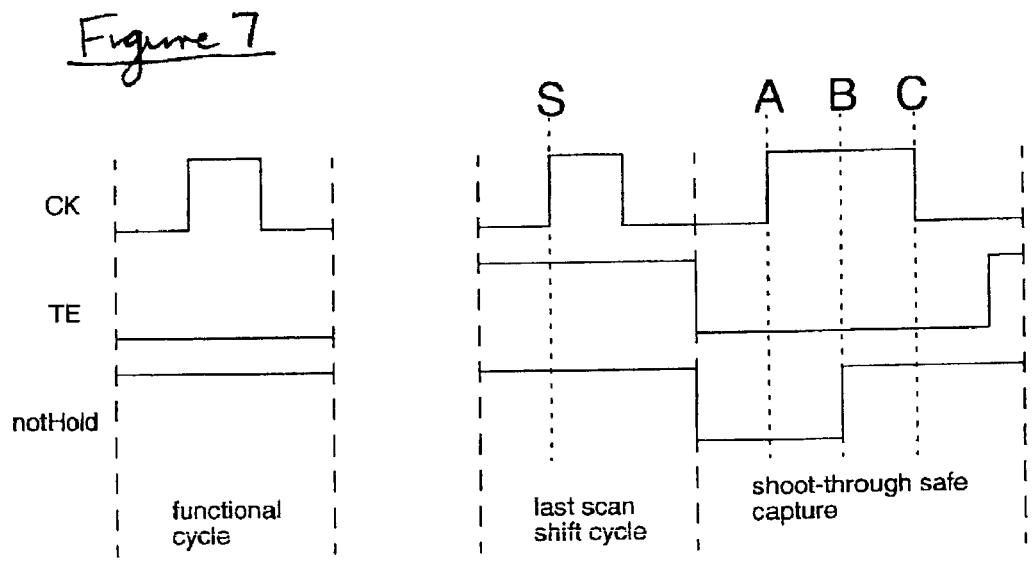
FIG. 7 is a signal timing diagram showing operation of the scan chain element of FIG. 6 in a number of modes.

The operation of the element of FIG. 6 is shown in FIG. 7. During the functional cycle (i.e., when the integrated circuit is performing its intended use in an end product), notHold is held high and tst_scanenable signal TE is held low. The CK signal is supplied to both the first and second latches. Shoot-through should not be an issue in this mode, since the circuit is carefully designed and analyzed to ensure it is robust in terms of functional clock domains.

During the scan-shift procedure, both notHold and TE are held high. In the illustrated case, it is assumed that shoot-through is not an issue during scan-shifts. This is because it is typical to arrange that only those latches clocked by a common clock within a clock domain are connected to a particular scan chain. At time S (the rising edge of CK) during the last clock cycle in the scan-shift cycle, all the scan elements are loaded with test data. The functional combinatorial logic then evaluates, generating test data ready for capture in the capture cycle.

At the start of the scan-capture cycle and whilst CK is low, notHold is taken low. This has the effect of isolating the state of the second latch. The second latch holds the data that is of interest during the scan-capture cycle. At time A, the clock CK goes high, which captures the data at the input D into the first latch. Since notHold is held low, the second latch still retains the data it captured earlier. In the context of a larger scan-chain, where D would be connected to the output of an earlier scan chain element, the master (first) and slave (second) latches are effectively separated and holding the response and stimulus data respectively.

With a prior art scan-chain element, the value captured into the second latch at time A would pass through the open master, potentially changing the value of Q and causing the logic to start to re-evaluate. This re-evaluation is undesirable, since it leads to races between clocks and data. If clock paths are slower than data paths, the wrong data can be captured.

Returning to FIG. 7, once the response of the logic under test has been safely captured into the master latch, it is transferred to the slave latch by taking notHold high. Time B may be several tens of nanoseconds after time A. The exact timing of B is not particularly important, but it should be greater than the maximum delay between the clock source at the pads and the clock sink at the scan elements.

At time C, the clock CK falls to a low value. The first latch is then open and the slave closes. Again, the timing of C is not critical, but it will typically be several tens of nanoseconds after time B using current technology.

The response data can then be read out through the scan chain as would normally be done in the prior art.

Figure 8:
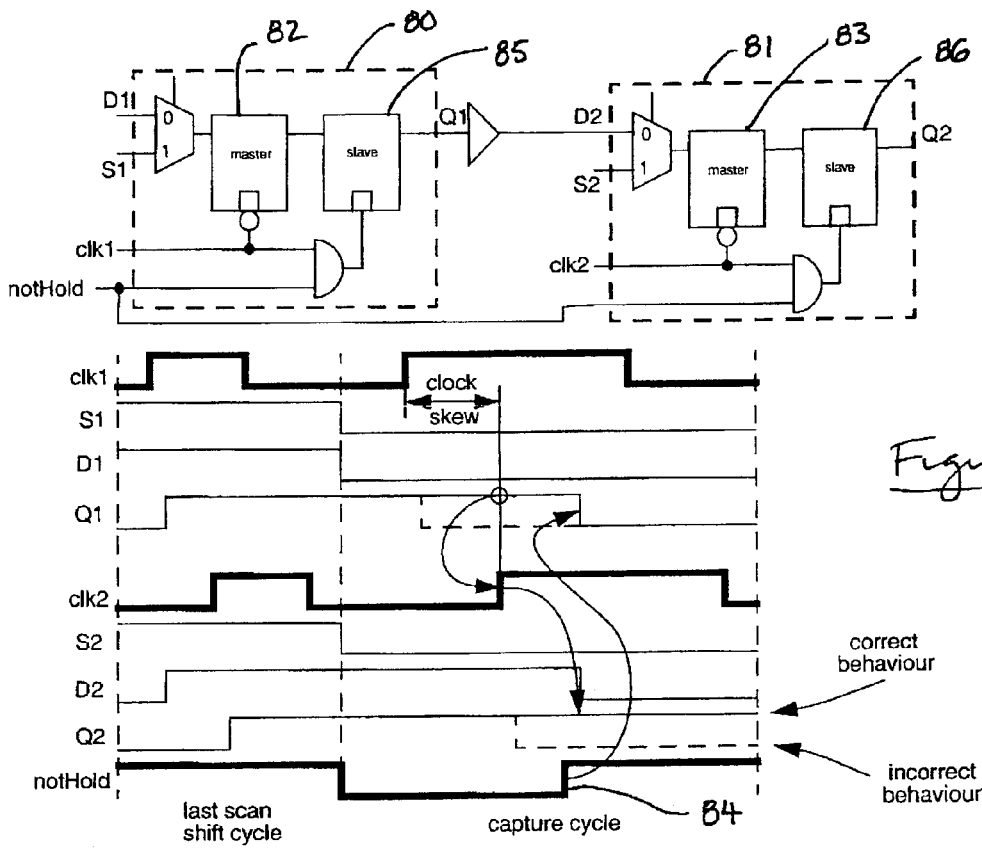
FIG. 8 is a schematic and associated signal timing diagram of two of the scan chain elements of FIG. 6.

FIG. 8 shows an arrangement similar to that in FIG. 5, except that the shoot-through safe flip-flops 80 and 81 are used. As in FIG. 7, the timing diagram shows that during the capture cycle, the notHold signal is held low whilst data D1 and D2 are clocked into the master latches 82 and 83 of first and second flip-flops 80 and 81 respectively. Once this has happened, notHold is brought high 84, which clocks the latched data into the respective slave latches 85 and 86 of each of the flip-flops 80 and 81. The data can then be clocked out of the scan-chain in the usual way.

It will be appreciated that the shoot-through safe waveform described for the scan-capture cycle can also be implemented during the scan-shift cycle.

Whilst it would be desirable to apply the invention to all flip-flops in a given device, it will be appreciated that the significant cost in extra area taken up by the additional logic and routing of the notHold test signal makes this an unlikely solution. A more practical approach is to replace flip-flops on the output boundary of an IP block with the shoot-through safe flip-flop of the present invention, which will give much of the advantage but significantly less usage of space. However, the precise number of and proportion of shoot-through safe flip-flops used will vary depending upon the particular application requirements of each design.

Although an exemplary embodiment of the method and apparatus of the present invention has been illustrated in the accompanying Drawings and described in the foregoing Detailed Description, it is understood that the invention is not limited to the embodiment disclosed.

For example, it is understood that the gate 61 may be utilized in a scan chain element in which the master latch is transparent when the clock signal is high and the slave latch is transparent when the clock signal is low (i.e., in a scan element performing as a negative edge-triggered flip flop). Further, it is understood that the particular circuitry for implementing gate 61 may vary. It is further understood that circuitry other than logic AND gate 61 may be utilized so long as the input notHold may allow slave latch 21 to receive the input clock CK when input notHold is in a first logic state, and prevent the input clock CK from being received at slave latch 21 when input notHold is in a second logic state different from the first logic state.

The invention is thus capable of numerous rearrangements, modifications, and substitutions without departing from the spirit of the invention as set forth and defined by the following claims.

What is claimed is:

1. A scan chain element in an integrated circuit, the scan chain element comprising:
    a first latch connected to accept test data as an input;
    a second latch connected to accept an output of the first latch as an input; and
    control logic for accepting a clock signal and a hold signal having a controllable state;
    the scan chain element being operable in a first mode such that the control logic is configured to supply the clock signal to latch the first latch and subsequently, in response to a change in the controllable state of the hold signal, to supply the clock signal to latch the second latch a controllable period of time after the clock signal is supplied to latch the first latch so as to latch the data from the output of the first latch.

2. A scan chain element according to claim 1, wherein the clock signal is supplied to latch the second latch upon the state controllable hold signal transitioning to a first logic state.

3. A scan chain element according to claim 1, further comprising a multiplexer controllable by a test enable signal to supply either a data signal or a test signal to an output of the multiplexer, the scan chain element being operable in a second mode in which the test enable signal selectively causes the data signal to be output by the multiplexer, and the control logic is configured such that the first and second latches are configured to operate as a d-type flip-flop responsive to the clock signal.

4. A scan chain element according to claim 1, wherein the control logic includes logical AND circuitry accepting as inputs the clock signal and the state controllable hold signal and generating an output as the clock signal coupled to the second latch.

5. A scan chain element according to claim 1, wherein the first and second latches are triggered by different edge directions of the clock signal.

6. A method of capturing data in a scan chain for testing circuitry, the scan chain including a plurality of scan chain elements, each of the scan chain elements including a first latch connected to accept test data as an input, a second latch connected to accept the output of the first latch as an input, and control logic for accepting a clock signal and a hold signal having a controllable state, the method comprising the steps of:
    for each scan chain element, supplying the clock signal to the first latch, thereby to latch in the test data therein;
    for each scan chain element, deasserting the state controllable hold signal for a selected period of time following supplying the clock signal to latch the first latch and then asserting the state controllable hold signal; and
    for each scan chain element, in response to the state controllable hold signal being asserted, supplying the clock signal to the second latch to latch the data from the output of the first latch.

7. A method according to claim 6, wherein each scan chain element further includes a multiplexer accepting the test data and non-test data, the output of the multiplexer being selectable by a test enable signal, the method further including controlling the test enable signal to select the test data as an output of the multiplexer prior to supplying the clock signal to the first latch.

8. A method according to claim 6, further comprising repeating the steps of supplying the clock signal to the first latch, deasserting and asserting the state controllable hold signal, and supplying the clock signal to latch the second latch.

9. A flip-flop circuit having a data input signal, a clock input signal, an output signal and a first control input signal, comprising:
    a master latch having a data input coupled to the data input signal, a clock input coupled to the clock input signal and at least one output;
    a slave latch having a data input coupled to output of the master latch, a clock input and at least one output; and
    control circuitry, disposed between the clock input signal and the clock input of the slave latch, for selectively passing the clock input signal to latch the slave latch based upon a value of the first control input signal which changes state a selectable period of time following application of a certain clock input signal state to latch the master latch.

10. The flip-flop circuit of claim 9, wherein the control circuitry passes the clock input signal to the slave latch when the first control input signal is in a first logic state, and prevents the clock input signal from appearing at the slave latch when the first control input signal is in a second logic state.

11. The flip-flop circuit of claim 9, wherein the master latch and the slave latch latch data during opposite logic states of the clock input signal.

12. The flip-flop circuit of claim 9, further comprising a second data input signal and:
   a multiplexer circuit having a first input coupled to the data input signal, a second data input coupled to the second data input signal of the flip flop, and an output coupled to the data input of the master latch.

13. The flip-flop circuit of claim 12, further comprising a second control input signal, and wherein the multiplexer circuit includes a control input coupled to the second control input signal.

14. The flip-flop circuit of claim 9, wherein the control circuitry performs a logical AND operation between the clock input signal and the first control input signal.

15. The flip-flop circuit of claim 9, wherein the flip-flop circuit is positive edge triggered.

16. A method of testing an integrated circuit having a plurality of scan-configurable flip-flops, each flip-flop including a master latch having a clock input and a slave latch having a clock input, comprising the steps of:
   configuring the flip-flops to be operable as at least one scan chain;
   shifting test data into the at least one scan chain;
   configuring the flip-flops to be capable of receiving non-test data;
   applying a latching logic value to the clock input of the master latches of the flip-flops so that so that the master latches latch the non-test data; and
   selectively applying logic values to the clock input of the slave latches of the flip-flops in response to a state controllable hold signal, wherein selectively applying comprises:
      holding the clock input of the slave latches at a non-latching logic value in response to the state controllable hold signal having a first state; and
      taking the clock input of the slave latches to a latching logic value in response to the state controllable hold signal having a second state, the nonlatching logic value changing to the latching logic value a state controllable hold signal selected period of time after the latching logic value is applied to the clock input of the master latches, so that the slave latches become transparent during approximately the selected period of time following when the master latches latch the non-test data.

17. The method of claim 16, wherein the step of applying the first logic value to the clock input of the master latches comprises applying at least one external clock input signal having the first logic value; and
   the step of applying the clock input of the slave latches comprises applying at least one external test signal having one of a first logic value and a second logic value the predetermined period of time following the step of applying the at least one external clock input signal.

18. The method of claim 16, further comprising the step of applying the at least one external test signal having the other of the first logic value and the second logic value, and repeating the steps of configuring the flip-flops to be operable as the at least one scan chain, shifting, configuring the flip-flops to be capable of receiving non-test data, applying a logic value to the clock inputs of the master latches and applying the logic value to the clock inputs of the slave latches.

19. A method of controlling a flip-flop having a master latch and a slave latch, comprising the steps of:
   applying a first clock signal to a clock input of the master latch so as to cause the master latch to latch a data value; and
   applying a second clock signal to a clock input of the slave latch so as to cause slave latch to latch an output data value from the master latch, wherein applying the second clock signal comprises applying a latching edge of the second clock signal offset by a controllable period of time following a latching edge of the first clock signal being applied to the master latch, so as to cause the slave latch to be transparent to the master latch output data value during approximately the period of time.

20. The method of claim 19, wherein the flip-flop receives a control signal, and the step of applying the second clock signal to the slave latch comprises responding to the control signal to control an amount of the controllable period of time.

* * * * *

UNITED STATES PATENT AND TRADEMARK OFFICE
CERTIFICATE OF CORRECTION

PATENT NO. : 7,038,494 B2
APPLICATION NO. : 10/274098
DATED : May 2, 2006
INVENTOR(S) : Gary Morton It is certified that error appears in the above-identified patent and that said Letters Patent is hereby corrected as shown below:

Column 8, line 28      Replace "cause slave latch"
Claim 19               With --cause the slave latch--

Signed and Sealed this

Twelfth Day of December, 2006

JON W. DUDAS
*Director of the United States Patent and Trademark Office*